US005895967A

United States Patent [19]

Stearns et al.

[11] Patent Number: 5,895,967
[45] Date of Patent: Apr. 20, 1999

[54] BALL GRID ARRAY PACKAGE HAVING A DEFORMABLE METAL LAYER AND METHOD

[75] Inventors: William P. Stearns, Richardson; Nozar Hassanzadeh, Plano; Navinchandra Kalidas, Houston, all of Tex.

[73] Assignee: Texas Instruments Incorporated, Dallas, Tex.

[21] Appl. No.: 09/108,552

[22] Filed: Jul. 1, 1998

Related U.S. Application Data

[60] Provisional application No. 60/051,859, Jul. 7, 1997.
[51] Int. Cl.$^6$ .................................................. H01L 23/52
[52] U.S. Cl. ...................... 257/691; 257/706; 257/778; 257/780
[58] Field of Search ........................ 257/706, 707, 257/691, 778, 780, 781; 438/108, 125

[56] References Cited

U.S. PATENT DOCUMENTS

| 5,763,947 | 6/1998 | Bartley | 257/691 |
| 5,777,265 | 7/1998 | Bhattacharyya et al. | 257/691 |
| 5,796,170 | 8/1998 | Marcantonio | 257/691 |
| 5,798,571 | 8/1998 | Nakajima | 257/691 |

Primary Examiner—Carl Whitehead, Jr.
Assistant Examiner—S. V. Clark
Attorney, Agent, or Firm—Mark E. Courtney; W. James Brady, III; Richard L. Donaldson

[57] ABSTRACT

A ball grid array package (62) having a deformable metal layer (20) is provided that includes a heat spreader (60), a stiffener (40) having a cavity and mounted to the heat spreader (60), a substrate (22), and a die (50). The substrate (22) includes a dielectric layer (10) with a cavity and cut-outs, the deformable metal layer (20), and a plurality of electrical traces for connection to solder balls. The dielectric layer (10) couples to the stiffener (40) through a second side and to the deformable metal layer (20) through the first side. The deformable metal layer (20) includes a cavity, a power ring (26), a ground ring (24), and a plurality of traces serving as either a ground connection, a signal connection, or a power connection for coupling with the plurality of solder balls. The deformable metal layer (20) also has a plurality of deformable metal layer portions each partially positioned over one of the cut-outs in the dielectric layer (10) and electrically coupled to the stiffener (40) through the cut-out. Each of the plurality of deformable metal layer portions also couples with one or more of the plurality of traces. The die (50) is mounted to the heat spreader (60) through the cavity of the substrate (22) and the stiffener (40). The present invention also provides a method for forming the ball grid array package (62).

25 Claims, 4 Drawing Sheets

BALL GRID ARRAY PACKAGE HAVING A DEFORMABLE METAL LAYER AND METHOD

This application claims priority under 35 USC § 119(e)(1) of provisional application number 60/051,859 filed Jul. 7, 1997.

TECHNICAL FIELD OF THE INVENTION

This invention relates in general to the field of semiconductor device packaging, and more particularly to a ball grid array package having a deformable metal layer and method.

BACKGROUND OF THE INVENTION

The use of ball grid arrays (BGAS) to package electronic circuits and devices such as integrated circuit chips is becoming more prevalent. BGA packaging has proven to provide substantial advantages over other packaging techniques such as, for example, dual in-line packages (DIPs), pin grid array (PGA) packages, tape carrier packages (TCPs), and quad flat packs (QFPs). The advantages of BGA packaging become especially significant when used to package an integrated circuit chip or die having a high pin count and when used to package devices employing high frequency signals. BGA packaging provides the additional advantage of being able to use conventional surface mount technologies (SMTs) and assembly techniques when mounting to a printed circuit board (PCB).

A BGA package generally includes a die or chip, one or more substrate layers provided on top of one another and aligned through a cavity portion, an array of solder balls for providing an electrical and mechanical connection external to the BGA package, and a heat spreader/stiffener for providing a thermal conduction path to cool the die and to provide mechanical support and rigidity to the BGA package. The substrate layers include metal layers and traces that serve as signal and/or power distribution connections in addition to distinct power and ground planes.

Each of the solder balls of the array of solder balls is positioned on an exposed substrate and electrically coupled to either a ground pad, a power pad, or a signal pad provided by the various substrate layers. Some of the solder balls may also couple to sacrificial pads that are provided for mechanical advantages and do not provide an electrical connection to the package. The electrical connections are generally made through vias or metallized interconnections provided through the various substrate layers. The fabrication of the vias and substrate layers is expensive, time consuming, and reduces the overall packaging yield and reliability of high pin-count packages.

A die is generally mounted on the heat spreader/stiffener using an adhesive or glue such as an epoxy. The die bond pads are electrically coupled to the various solder balls of the array of solder balls by directly coupling the die bond pads to either the ground plane, the power plane, or to a corresponding signal trace of one of the substrate layers. The connection is generally provided using wire bonding techniques. These connections are expensive and complicated by the fact that connections must be made with multiple substrate layers.

The fabrication of the substrate layers, metal layers, and traces is expensive. In general, multiple substrate layers and multiple vias result in lower BGA package fabrication yields and higher costs. The formation of the vias create additional complexity and cost because each of the vias generally require the formation of a conductive layer, such as a metal layer on the internal walls of the via, to ensure a complete electrical path. This may be referred to as metallization. The metallization of the internal walls of each via increases the overall complexity and cost of manufacturing multiple substrate layer BGA packages.

SUMMARY OF THE INVENTION

From the foregoing it may be appreciated that a need has arisen for a ball grid array package having a deformable metal layer and method that uses a single substrate layer having a single, deformable metal layer which eliminates the need for expensive vias, such as metallized vias. The deformable metal layer of the present invention dispenses with the requirement of expensive multiple substrate layers and associated metal layers while still providing excellent electrical characteristics. In accordance with the present invention, a ball grid array package having a deformable metal layer and method is provided which substantially eliminates the disadvantages and problems outlined above.

According to the present invention, a ball grid array assembly having a deformable metal layer on a single substrate dielectric layer is provided that may be used in a ball grid array package. The ball grid array assembly includes a heat spreader, a stiffener, a dielectric layer, a power ring, a ground ring, a plurality of traces, and a plurality of deformable metal layer portions. The stiffener has a cavity formed therein and is mounted to the heat spreader. The dielectric layer has a first side, a second side, and a cavity and cut-outs formed therein. The dielectric layer is coupled to the stiffener through the second side. The power ring, the ground ring, and the plurality of traces are provided on the first side of the dielectric layer. The plurality of deformable metal layer portions are provided on the first side of the dielectric layer with each one of the plurality of deformable metal layer portions partially positioned over one of the cut-outs and electrically coupled to the stiffener through the cut-out. At least one of the plurality of deformable metal layer portions is coupled to at least one of the plurality of traces on the first side of the dielectric layer. The power ring, the ground ring, the plurality of traces, and the plurality of deformable metal layer portions will generally be formed from the deformable metal layer.

A complete ball grid array package may be formed by coupling a plurality of solder balls to the plurality of traces mounted on the ball grid array assembly which includes a heat spreader. A die may then be mounted to the heat spreader through the cavity, wire bonded to the ball grid array assembly as needed, and encapsulated. The stiffener serves as either the ground plane or the power plane of the ball grid array package, depending on the desired implementation. If the stiffener serves as the ground plane, it is electrically coupled with the ground ring and select traces of the plurality of traces that serve as ground connections. If the stiffener serves as the power plane, it is electrically coupled with the power ring and select traces of the plurality of traces that serve as power connections.

According to another aspect of the present invention, a method for forming a structure using a deformable metal layer is provided. The method includes the step of forming a cavity and cut-outs in a dielectric layer and bonding a deformable metal layer to the dielectric layer to form a substrate. In alternative embodiments, the step of bonding the deformable metal layer to the dielectric layer to form the substrate is performed before the step of forming the cavity and cut-outs in the dielectric layer. The method further includes the steps of forming a cavity opening, a power ring, a ground ring, and a plurality of traces using the deformable metal layer with each of the plurality of traces serving as either a ground connection, a signal connection, or a power connection. The method also includes the step of mounting a stiffener to a heat spreader with the stiffener having a cavity formed therein. Finally, the method includes the step of mounting the substrate to the stiffener and deforming portions of the deformable metal layer over the cut-outs to electrically couple these portions to the stiffener.

The present invention provides a multitude of technical advantages. One technical advantage of the present invention includes the elimination of expensive multiple substrate layers and associated metal layers in a ball grid array assembly and package while still maintaining high quality electrical characteristics. For example, the electrical benefits of a controlled impedance obtained previously only through a multiple metal layer substrate are provided. The presence of a ground plane in close proximity to the plurality of signal traces provides a reduced inductance that results in a controlled signal line impedance that is especially beneficial when used with high pin count and high frequency devices. Another technical advantage of the present invention includes the use of an existing mechanical packaging component to serve as both a mechanical component and an electrical component to simplify the fabrication of a BGA package and to reduce overall fabrication costs. Yet another technical advantage of the present invention includes enhanced signal trace density and signal line routing capability. Still yet another technical advantage includes the elimination of the need to form vias, such as metallized vias, through a substrate. This significantly reduces overall packaging costs. Another technical advantage includes improved package reliability by reducing packaging complexity. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

It should be noted at the outset that the various components, layers, and elements of the FIGURES are not drawn to scale in order to more clearly illustrate the invention. The various components, layers, and elements may be provided in various thicknesses.

Figure 1:
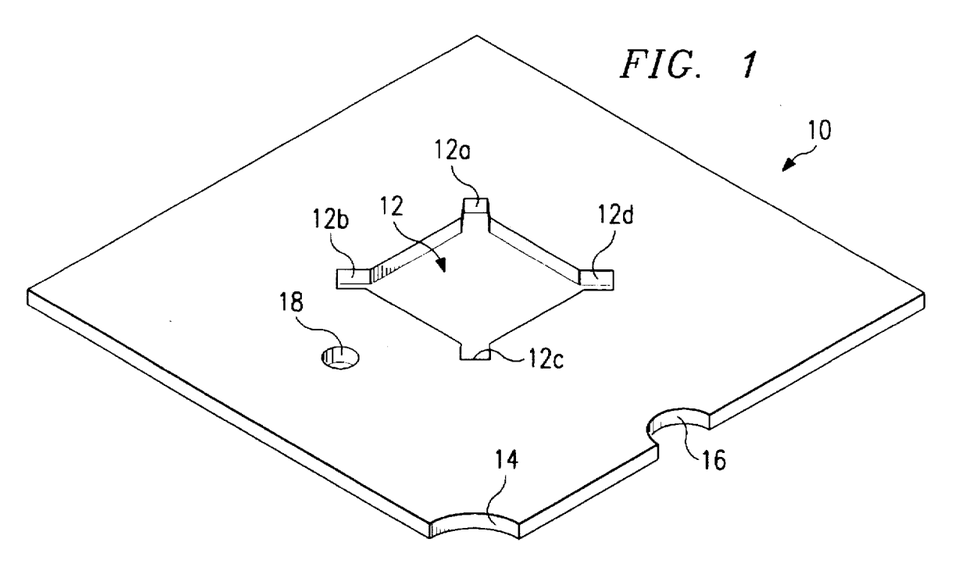
FIG. 1 is a perspective view illustrating one embodiment of a dielectric layer having a cavity and cut-out portion formed therein.

FIG. 1 is a perspective view illustrating one embodiment of a dielectric layer 10 having a cavity 12 and various cut-out portions formed therein. Dielectric layer 10, in the embodiment shown in FIG. 1, will generally be provided in a rectangular or square configuration and will include a variety of cut-out portions positioned around dielectric layer 10. It should be noted that the various cut-out portions illustrated in FIG. 1 are merely one example of the multiplicity of possible cut-out configurations and cut-out positions that may be provided in and around dielectric layer 10. In the one embodiment illustrated in FIG. 1, cut-outs are provided at each corner of a cavity 12. A cavity cut-out 12a, 12b, 12c, and 12d are shown. A corner cut-out 14 is also provided along with a side cut-out 16 and an internal cut-out 18.

Dielectric layer 10 may be fabricated using virtually any substrate dielectric or insulator material such as a thin film of polyimide or an organic resin based glass fiber reinforced dielectric laminate. Preferably, dielectric layer 10 is provided as a polyimide film layer.

Figure 2:
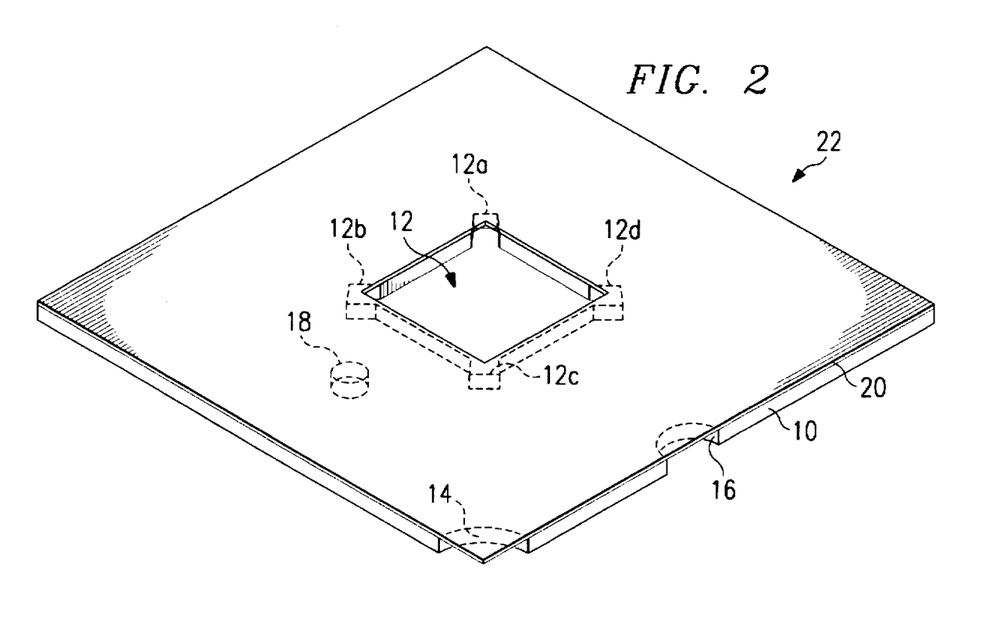
FIG. 2 is a perspective view illustrating a structure with a deformable metal layer provided on a first side of the dielectric layer.

FIG. 2 is a perspective view illustrating a structure 22 with a deformable metal layer 20 attached to a first side of dielectric layer 10. Deformable metal layer 20 is attached to dielectric layer 10 using any available means such as an adhesive or other means typically used with a film circuit or rigid printed circuit board substrates. Deformable metal layer 20 may be provided as any known or available metal or conductive material that will preferably be provided as a foil layer. Deformable metal layer 20 may be implemented, for example, as a gold, nickel, or copper foil layer. In other embodiments, deformable metal layer 20 may be implemented as an alloy of the previously mentioned metals or combinations of a variety of other types of metals and materials.

Deformable metal layer 20 must be flexible such that the portions of deformable metal layer 20 residing over the cut-out portions of dielectric layer 10 may be deformed or configured to reside within or through these cut-out portions. For example, portions of deformable metal layer 20 residing above cavity cut-out 12a, 12b, 12c, 12d, corner cut-out 14, side cut-out 16, and internal cut-out 18 may be deformed, pressed, conformed, and the like such that these portions of deformable metal layer 20 may reside through the corresponding cut-out. This will be illustrated more fully below.

Figure 3:
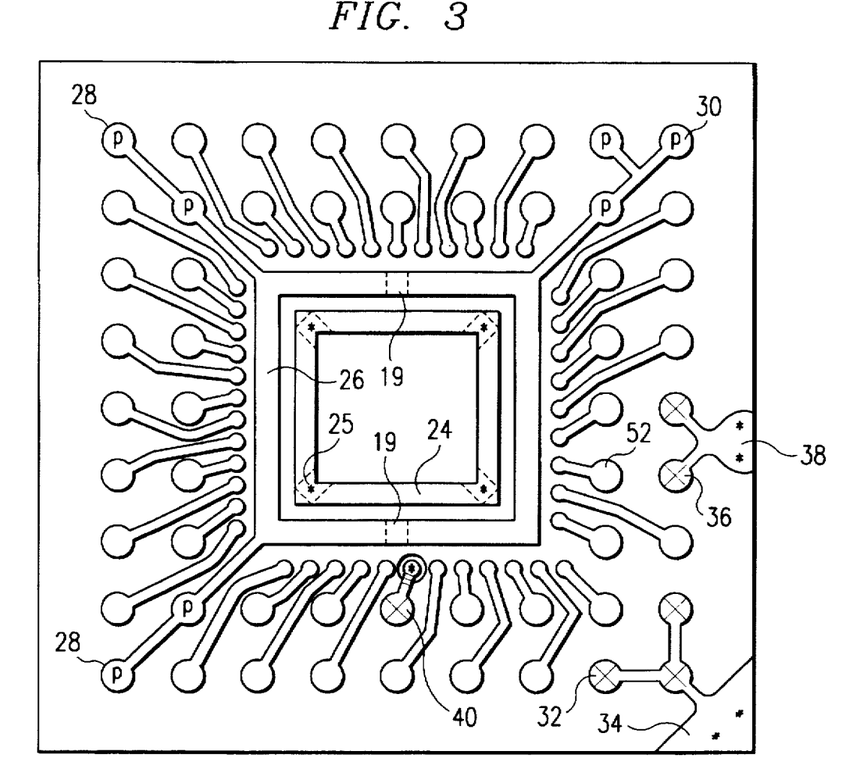
FIG. 3 is a top view illustrating a ground ring, a power ring, and a plurality of traces formed from the deformable metal layer, and the electrical coupling between the portions of the deformable metal layer positioned over the cut-outs and a stiffener provided on a second side of the dielectric layer.

FIG. 3 is a top view illustrating a ground ring 24, a power ring 26, and a plurality of traces, such as a signal trace or signal connection 52, formed from deformable metal layer 20. FIG. 3 also illustrates the electrical coupling between the portions of deformable metal layer 20 positioned or residing over the cut-outs in dielectric layer 10 and an electrically conductive stiffener 40 (not shown in FIG. 3). Stiffener 40 is provided on a second side of dielectric layer 10. It should be mentioned that the arrangement, layout, and configuration of ground ring 24, power ring 26, and the plurality of traces illustrated in FIG. 3 are only exemplary. In an actual implementation when practicing the present invention, any desirable or convenient arrangement may be employed.

The formation of power ring 26, ground ring 24, and the plurality of traces may be accomplished using any known or available technique. For example, deformable metal layer 20 may be selectively exposed and etched using various techniques, such as chemical etching techniques, to create the various traces and configurations illustrated in FIG. 3.

Ground ring 24, in the embodiment of FIG. 3, is shown surrounding the cavity which may be referred to as a die cavity. Ground ring 24 has its corner portions deformed or pressed through the underlying cavity cut-out portions of dielectric layer 10. For example, corner 25 is shown with dashed lines and an asterisk or star to indicate that corner portion has been deformed to electrically couple with the underlying stiffener 40.

Power ring 26, in the embodiment of FIG. 3, is provided surrounding ground ring 24. Power ring 26 and ground ring 24 may be provided in virtually any convenient or advantageous configuration as desired or as dictated by the electrical needs and the layout of the die that will ultimately be provided in the die cavity. This may include a continuous ring, a discontinuous ring, multiple rings, extensions, and the like. For example, reference numeral 19 is provided on two sides of power ring 26 and is shown with dashed lines. These dashed lines indicate that power ring 26 may be interrupted at this point and provided as two electrically separate structures.

Power ring 26 is also provided with extensions at three of its corners. Extensions 28 are shown on the left-hand side with circular traces or bond pads provided at each extension 28. These circular traces or bond pads serve as power connections because they couple to power ring 26. For example, extensions 28 each include two circular traces or pads with the letter "p" provided in each circular trace. These circular traces will eventually couple with solder balls to provide external electrical connections to the package. Extension 30 is shown to illustrate another possible extension from power ring 26. In this case, three power connections are provided which will also ultimately couple to solder balls. Power ring 26 and the associated power connections serve as a power plane for the package. In alternative embodiments, power ring 26 and ground ring 24 may be swapped such that power ring 26 electrically couples to stiffener 40.

The plurality of traces provided include ground connections, power connections, and signal connections. Each of these connections will generally include a circular bond pad portion that will ultimately be coupled to a solder ball. The ground connections are designated with an "X" provided in their center. For example, a ground connection 40 is illustrated in FIG. 3. The signal connections also include a trace or extension portion that extends towards the die cavity. This trace or extension portion that extends towards the die cavity will ultimately be used to wire bond each individual signal connection to a corresponding signal die bond pad of a chip or die. For example, a signal connection 52 is provided in FIG. 3. Finally, various power connections, such as power connections 28 and 30, as discussed previously, are provided. The power connections couple with power ring 26 and may be provided, in one embodiment, as part of the diagonal extensions provided at each corner of power ring 26.

In addition to the plurality of traces, FIG. 3 also illustrates how the portions of deformable metal layer 20 positioned over the various cut-outs electrically couple with one or more of the plurality of traces. For example, trace 40, which serves as a ground connection, is shown coupled to a portion of deformable metal layer 20 that resides over internal cut-out 18. Similarly, deformable metal layer portion 34 is shown coupled to three traces or pads that serve as ground connections and are indicated with the reference numeral 32. Deformable metal layer portion 34 is deformed and provided through corner cut-out 14 as illustrated previously in FIGS. 1 and 2. Similarly, a deformable metal layer portion 38 is shown coupled with two traces or pads that also serve as ground connections in this embodiment and are indicated with the reference numeral 36. These traces or pads will ultimately be coupled with a solder ball when the ball grid array package is completely assembled. Deformable metal layer portion 38 is provided through side cut-out 16 as illustrated in FIGS. 1 and 2. The various deformable metal layer portions allow for ground connections to be conveniently located in hard to reach areas and corners. This greatly simplifies overall trace layout design and ensures that package "real estate" or area is not wasted.

Figure 8:
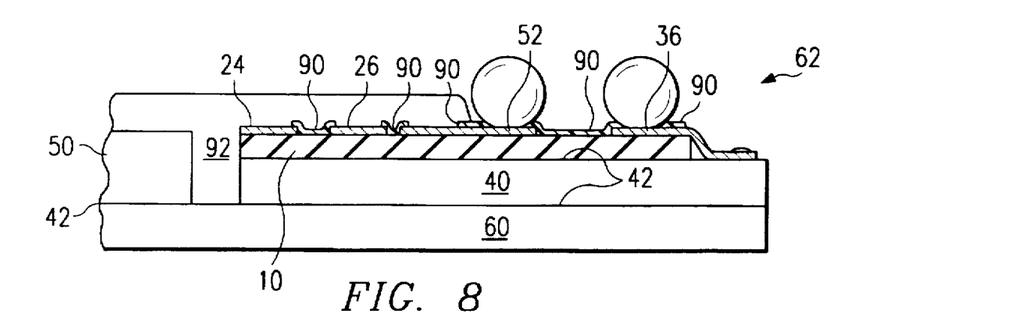
FIG. 8 is a sectional view of the ball grid array package that is similar to FIG. 6 except for the addition of a solder mask layer and an encapsulant.

A solder mask layer, not shown in FIG. 3, is typically provided over the surface of deformable metal layer 20, which is now provided as ground ring 24, power ring 26, the plurality of traces, and the plurality of deformable metal layer portions. The solder mask layer will be provided with openings at connections where solder balls will ultimately attach such as those indicated by reference numerals 52, 36, 32, 40, 28, etc. The solder mask layer will also include a large enough opening around the die cavity to allow a die to be wire bonded to ground ring 24, power ring 26, and the various signal traces. The presence of the solder mask layer opening around the die cavity also allows the die and the wire bond connections to be sealed or encapsulated to further protect the package. An example of a solder mask layer is illustrated in FIG. 8 and is shown as a solder mask layer 90.

Figure 4:
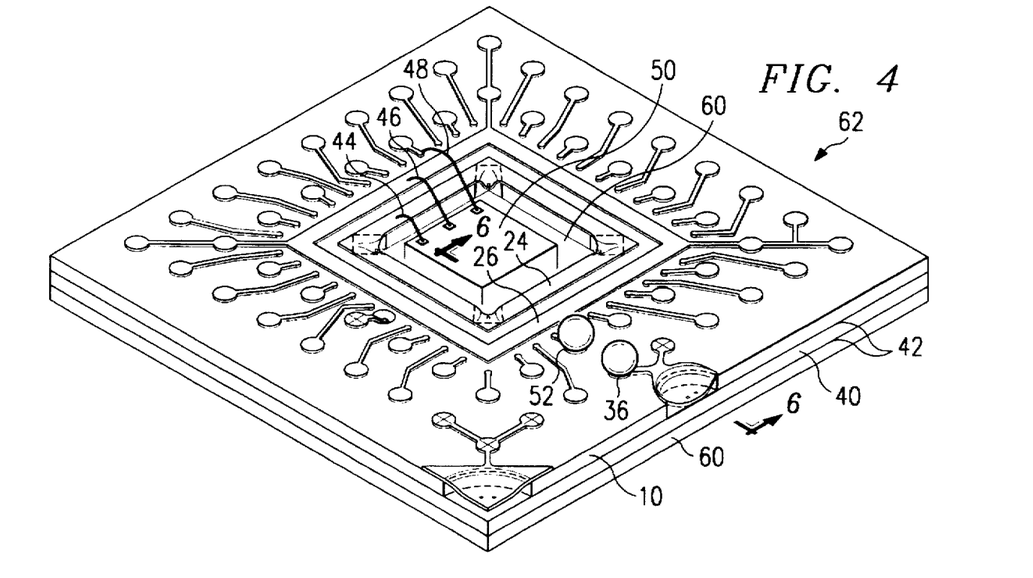
FIG. 4 is a perspective view illustrating a ball grid array package implementing the layout of FIG. 3.

FIG. 4 is a perspective view illustrating a ball grid array package 62 implementing the layout of FIG. 3. Ball grid array package 62 includes, in addition to what was previously illustrated in FIG. 3, a die 50 that is mounted or attached within the die cavity, an electrically conductive stiffener 40 mounted on the second side of dielectric layer 10, and a heat spreader 60 mounted on the other side of the stiffener 40. An epoxy 42 is shown provided between the various layers. Epoxy 42 may be any available adhesive or thermal epoxy appropriate for coupling the various layers. The layer of epoxy 42 that is provided between stiffener 40 and dielectric layer 10 is applied in a pattern to prevent the epoxy layer from occupying such areas as cavity cut-outs 12a, 12b, 12c, 12d, corner cut-out 14, side cut-out 16, and internal cut-out 18, as previously shown in the one embodiment of FIG. 1. Similarly, an epoxy or adhesive will be used to mount die 50 to heat spreader 60 within the die cavity. Die 50 is mounted to heat spreader 60 through a cavity in both stiffener 40 and structure 22.

Die 50 includes various power die bond pads, ground die bond pads, and signal die bond pads. These are coupled, respectively, to power ring 26, ground ring 24, or a corresponding signal connection, as needed. Three exemplary wire bonds are illustrated in FIG. 4. For example, a wire bond 44 is shown provided from a ground die bond pad to ground ring 24. A wire bond 46 is shown coupled between a power die bond pad of die 50 and power ring 26. Similarly, a wire bond 48 is shown coupled between a signal die bond pad of die 50 and a signal connection.

The corners of ground ring 24 are shown deformed so that an electrical connection will be made between ground ring 24 and stiffener 40. This electrical connection allows stiffener 40 to serve as the active ground plane of ball grid array package 62. As such, stiffener 40 electrically couples with all of the ground connections. In the one embodiment of FIG. 4, all of the ground connections are made through the deformable metal layer portions. As was shown in FIG. 3, these various deformable metal layer portions couple through one or more cut-outs such as corner cut-out 14, side cut-out 16, and internal cut-out 18. Power ring 26 serves as the power plane of ball grid array package 62 in the embodiment shown in FIG. 4. It should be mentioned that in alternative embodiments, stiffener 40 may serve as the power plane, and, as such, power ring 26 may include deformable metal layer portions or other means to couple with stiffener 40.

Solder balls will ultimately be mounted to the pads that are coupled to these deformable metal layer portions to serve as external electrical ground connections. One such solder ball is shown coupled to ground connection 36. A solder ball is also shown coupled to a signal trace or connection 52 which will ultimately be electrically coupled to a signal die bond pad of die 50. For example, wire bond 48 provides a coupling between a signal trace, that will ultimately be provided with a solder ball, and a signal die bond pad of die 50. Similarly, each of the pads of the traces coupled to power ring 26 will also have solder balls attached. The solder balls are typically composed of eutectic Sn63/Pb37 or similar compositions. However, it should be understood that the present invention is not limited to any particular composition or type of solder ball.

Heat spreader 60 serves to provide thermal enhancement to ball grid array package 62 by providing a thermal conductive path to remove heat generated by die 50. Heat spreader 60 may be implemented using any suitable material having suitable thermal and mechanical properties. Stiffener 40 provides mechanical support and rigidity to ball grid array package 62 and will be provided as an electrically conductive layer such as a metal or alloy layer. For example, stiffener 40 may be provided as virtually any conductive layer or metal layer suitable for attaching to a dielectric layer such as dielectric layer 10 and for providing structural rigidity. Preferably, stiffener 40 will be provided as a copper layer with a metal plating such as nickel, gold, palladium and the like.

Stiffener 40 may electrically couple with heat spreader 60 or, in other embodiments, stiffener 40 and heat spreader 60 may be electrically isolated through the adhesive or epoxy 42 that is used to attach the two layers. Heat spreader 60 and stiffener 40 may, in alternative embodiments, be provided as one structure that is electrically conductive.

Figure 5:
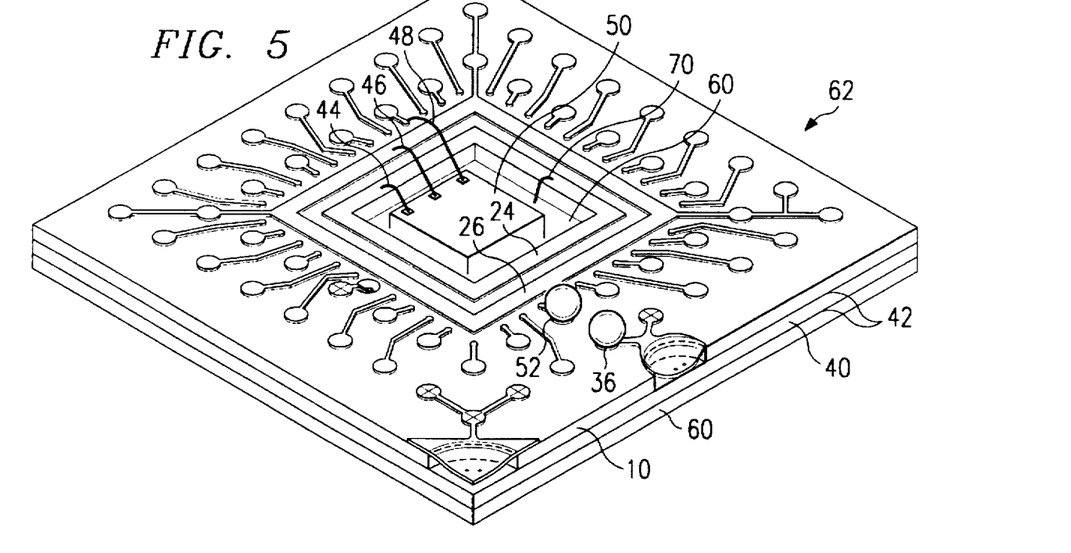
FIG. 5 is a perspective view illustrating an alternative implementation of the ball grid array package.

FIG. 5 is a perspective view illustrating an alternative implementation of ball grid array package 62. FIG. 5 is essentially identical to FIG. 4 except that the deformable metal layer portions that are positioned at the corners of ground ring 24 are not provided. Similarly, the cavity cut-outs, such as cavity cut-outs 12a, 12b, 12c, and 12d as illustrated in FIG. 1, will not be provided in dielectric layer 10. In this case, stiffener 40 still serves as the active ground plane and the various ground connections and associated solder balls are electrically coupled to stiffener 40 through the associated deformable metal layer portions such as those previously illustrated. Furthermore, ground ring 24 still couples to all of the ground die bond pads of die 50 as illustrated. However, ground ring 24 is electrically coupled to stiffener 40 through a wire bond 70.

Wire bond 70 is provided as merely one example of how ground ring 24 may couple to stiffener 40. Wire bond 70 may in fact be provided as a plurality of wire bonds to ensure that adequate current carrying capacity exists between ground ring 24 and stiffener 40. In the case where stiffener 40 and heat spreader 60 are electrically coupled, wire bond 70 may directly couple to heat spreader 60 through the die cavity as shown. Otherwise, wire bond 70 will couple directly to stiffener 40.

Figure 6:
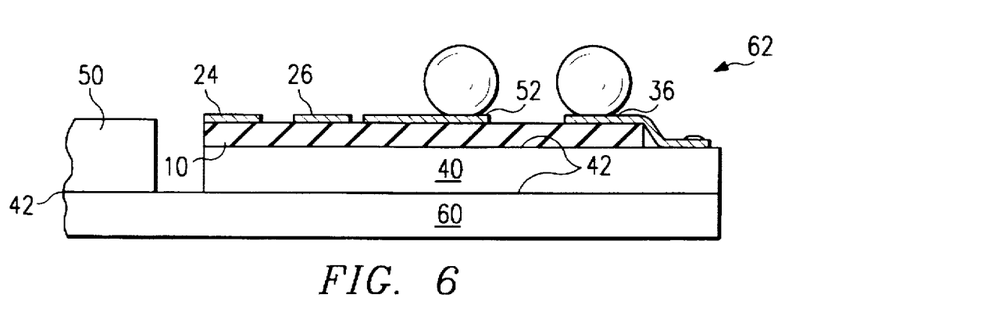
FIG. 6 is a sectional view of the ball grid array package taken/along line 6—6 of FIG. 4 illustrating the electrical coupling between a deformable metal layer portion, positioned over a cut-out, and the stiffener provided on the second side of the dielectric layer.

FIG. 6 is a sectional view of ball grid array package 62 taken along line 6—6 of FIG. 4 illustrating the electrical coupling between the deformable metal layer portion, positioned over side cut-out 16, and stiffener 40 provided on the second side of dielectric layer 10. As such, the solder ball provided at ground connection 36 is shown attached to the deformable metal layer portion which is deformed to electrically couple with stiffener 40. The deformed metal layer portion may electrically couple with stiffener 40 through the use of a spot weld or multiple spot welds such as that shown in FIG. 6. It should be noted, however, that the deformable metal layer portion may electrically couple with stiffener 40 using any known or available technique for electrically coupling two elements.

Ground ring 24 is shown provided next to the die cavity while power ring 26 is shown surrounding ground ring 24. Die 50 is shown mounted to heat spreader 60 through an epoxy or adhesive 42. In alternative embodiments, heat spreader 60 may contain a recess portion within the die cavity such that die 50 will be provided further below the upper surface of ball grid array package 62.

The thickness of dielectric layer 10 may be provided at any desired thickness to control or affect the electrical characteristics, such as impedance, of ball grid array package 62. Stiffener 40 serves as an active ground plane and the distance between stiffener 40 and the various signal lines or traces provided on the first side of dielectric layer 10 are influenced by this critical distance. It should also be reemphasized that the FIGUREs are not drawn to scale and the various components of ball grid array package 62, such as dielectric layer 10, stiffener 40, heat spreader 60, die 50 may be provided in a variety of different thicknesses.

Figure 7:
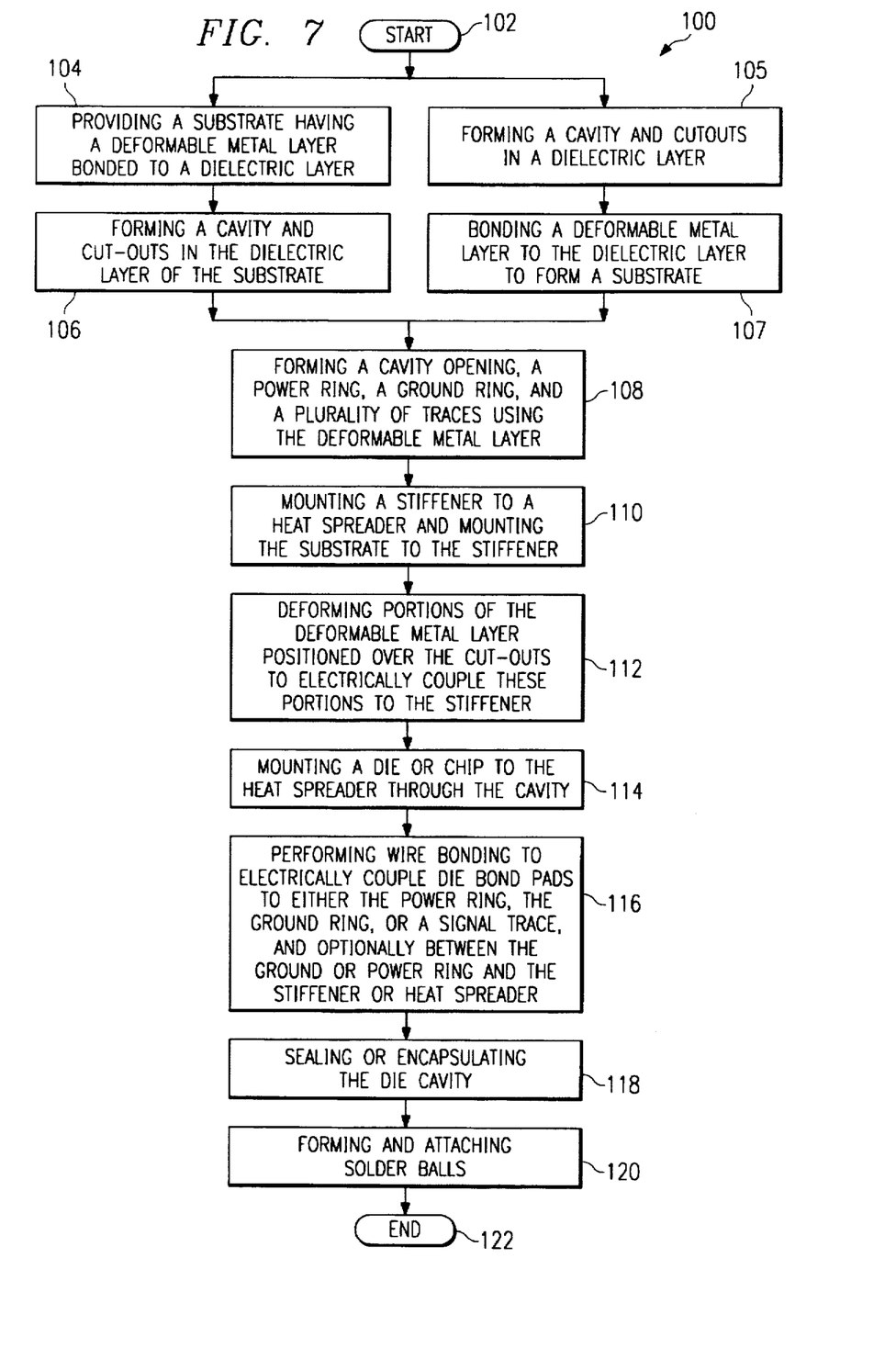
FIG. 7 is a flowchart illustrating an exemplary method for forming a ball grid array package having a deformable metal layer according to the teachings of the present invention.

FIG. 7 is a flowchart illustrating an exemplary method 100 for forming a ball grid array package having a deformable metal layer according to the teachings of the present invention. Method 100 begins at step 102 and proceeds to either step 104 or step 105 depending on the desired implementation. Proceeding first to step 104, a substrate having a deformable metal layer bonded to a dielectric layer is provided. The deformable metal layer may, in alternative embodiments of the present invention, be provided with a cavity opening. At step 106, a cavity and cut-outs are formed in the dielectric layer of the substrate. Generally, the cavity will be rectangular or square shaped and provided in the center of the substrate. However, it should be understood that the cavity may be provided in a variety of different locations and in a variety of different shapes. If a cavity opening is provided in the deformable metal layer in step 104, the cavity in the dielectric layer will be aligned in some manner with the cavity opening provided in the deformable metal layer. The cut-outs may be provided at any desired location depending upon the desired layout and design of a particular ball grid array package. Step 104 and step 106 will be performed in lieu of step 105 and step 107 if the cavity and cut-outs are formed in the dielectric layer after the deformable metal layer is bonded to the dielectric layer. Otherwise, method 100 proceeds from step 102 to step 105.

At step 105, a cavity and cut-outs are formed in a dielectric layer. As mentioned above, the cavity will generally be rectangular or square shaped and provided in the center of the dielectric layer. However, it should be understood that the cavity may be provided in a variety of different locations and in a variety of different shapes. Similarly, the cut-outs may be provided at any desired location depending upon the desired layout and design. Next, step 107 is performed where a deformable metal layer is bonded to the dielectric layer to form a substrate. The deformable metal layer may, in alternative embodiments of the present invention, be provided with a cavity opening that will be positioned over the cavity formed in the dielectric layer in step 105.

At step 108, a cavity opening is formed in the deformable metal layer, while a power ring, a ground ring, and a plurality of traces are formed using the deformable metal layer. The cavity opening will generally be provided coincident with the cavity formed in the dielectric layer. The power ring and ground ring may be provided in any available or known configuration. For example, the power ring and the ground ring may be provided as an uninterrupted ring, an interrupted ring, or multiple rings. Similarly, the power ring and the ground ring may be provided with a segment or a plurality of segments. The plurality of traces may serve as signal connections, ground connections, and power connections of the ball grid array package. The plurality of traces may also serve as sacrificial pads so that solder balls may be later attached to provide mechanical advantages. In alternative embodiments of the ball grid array package, solder balls may be attached at this point to provide both electrical and mechanical external connections.

It should be mentioned that a solder mask layer may be provided over the surface of the deformable metal layer with openings at the connections or pads of the traces where solder balls will ultimately attach. The solder mask layer will also include a sufficiently large enough opening around the substrate cavity and cavity opening in the deformable metal layer to allow a die to be wire bonded to the power ring, the ground ring, and the signal traces of the plurality of traces. The presence of the solder mask layer opening around the die cavity also allows the die and the wire bond connections to be sealed or encapsulated to further protect the package. An example of a solder mask layer and an encapsulant is illustrated in FIG. 8.

Proceeding next to step 110, a stiffener is mounted to a heat spreader, and the substrate is mounted to the stiffener. The substrate will generally be mounted to the stiffener using the side of the substrate opposite the deformable metal layer. This may be accomplished using any available adhesive such as a thermal epoxy. The stiffener will also generally be provided with a cavity that is coincident with the cavity in the substrate and the cavity opening in the deformable metal layer. The stiffener will be provided as an electrical conductor, while the heat spreader may or may not be provided as an electrical conductor. The stiffener and the heat spreader may or may not be electrically coupled to one another. In alternative embodiments, the stiffener and heat spreader may be provided as one structure or element.

At step 112, portions of the deformable metal layer positioned over or residing over the cut-outs are deformed or positioned to electrically couple these portions with the stiffener mounted on the opposite side of the substrate. In this manner, an inexpensive yet effective electrical coupling can be made from one side of the substrate to the other without having to form expensive metallized vias. In one embodiment, after the portions of the deformable metal layer are deformed and coupled to the stiffener, a spot weld may be provided to ensure a stable electrical connection. In this manner, overall reliability of the ball grid array package is enhanced. Furthermore, overall fabrication and packaging costs are substantially reduced.

In one embodiment, step 112 results in the ground ring being coupled to the stiffener so that the stiffener serves as the ground plane. In an alternative embodiment, step 112 results in the power ring being coupled to the stiffener so that the stiffener serves as the power plane. In still other embodiments, the ground ring may be coupled to the stiffener and/or the heat spreader using one or more wire bonds from the ground ring to the stiffener and/or the heat spreader through the cavity in the substrate so that the stiffener and/or the heat spreader serves as the ground plane. Similarly, still other embodiments may include the power ring coupled to the stiffener and/or the heat spreader using one or more wire bonds from the power ring to the stiffener and/or the heat spreader through the cavity in the substrate so that the stiffener and/or the heat spreader serves as the power plane.

At step 114, a die or integrated circuit chip is mounted to the heat spreader through the cavity in the substrate and stiffener. This may be accomplished using any available adhesive such as a thermal epoxy and the like. At step 116, wire bonding may be performed to electrically couple the various die bond pads of the die or integrated circuit chip. Wire bonding may also be used to couple either the ground ring or the power ring to the stiffener or heat spreader through the die cavity area. The various die bond pads are coupled to either the power ring, the ground ring, or a signal trace formed from one the plurality of traces using the deformable metal layer. At step 118, the die is sealed or encapsulated within the cavity of the substrate. This protects the die or integrated circuit chip and the various wire bond connections and minimizes potential open or short circuits and to protect the circuitry and wire bond connections from external elements.

Finally, at step 120 the solder balls are formed and attached to the various connection pads formed from the plurality of traces of the deformable metal layer of the substrate. This provides external electrical and mechanical connections to the ball grid array package. Generally, the solder balls will form a rectangular array of solder balls provided around the periphery of the ball grid array package. Method 100 ends at step 122.

FIG. 8 is a sectional view of ball grid array package 62 that is similar to FIG. 6 except for the addition of a solder mask layer 90 and an encapsulant 92. Solder mask layer 90 provides openings at connections where solder balls will ultimately attach, such as signal connection 52 and ground connection 36, and where the deformable metal layer deforms and attaches to the stiffener as illustrated. Solder mask layer 90 will also include an opening sufficiently large around the die cavity to allow die 50 to be wire bonded to power ring 26, ground ring 24, and the plurality of signal traces. After the various connections have been made, die 50 and the wire bond connections, such as wire bonds 44, 46, and 48 as shown in FIGS. 4 and 5, are typically sealed or encapsulated to further protect the semiconductor package. Encapsulant 92 is shown surrounding die 50, ground ring 24, power ring 26, and various electrical connections (such as those shown in FIGS. 4 and 5) and may be provided using any encapsulant such as those well known to one of ordinary skill in the art. Solder mask layer 90 is typically applied using conventional solder mask application techniques and conventional solder mask materials. For example, solder mask layer 90 may be an epoxy or acrylic solder mask material applied using conventional solder mask patterning and application techniques.

Thus, it is apparent that there has been provided, in accordance with the present invention, a ball grid array package having a deformable metal layer and method that satisfy the advantages set forth above. Although the preferred embodiment has been described in detail, it should be understood that various and numerous changes, substitutions, and alterations can be made herein without departing from the scope of the present invention. For example, although the present invention has been described and illustrated with stiffener 40 and heat spreader 60 being provided as two separate elements that may or may not be electrically coupled, the present invention also encompasses the implementation of stiffener 40 and heat spreader 60 as one structure. Also, the configuration of power ring 26, ground ring 24, and the plurality of traces can be provided in virtually any convenient or advantageous configuration without departing from the present invention. In fact, it should be understood that in this description and invention, the term "ring," such as it is used with power ring 26 and ground ring 24, is defined to include not only circular shapes and other configurations that define an enclosed area, but virtually any shape known, whether that shape defines a completely enclosed area or not. Furthermore, although the present invention has been described and illustrated with stiffener 40 serving as an active ground plane, the present invention also encompasses the use of stiffener 40 as a power plane. Other examples of changes, substitutions, and alterations are readily ascertainable by one skilled in the art and could be made without departing from the spirit and scope of the present invention as defined by the following claims.

What is claimed is:

1. A ball grid array assembly having a deformable metal layer, the ball grid array assembly comprising:
    a heat spreader;
    a stiffener having a cavity formed therein and mounted to the heat spreader;
    a dielectric layer having a first side and a second side, the dielectric layer having a cavity and cut-outs formed therein and coupled to the stiffener through the second side;
    a power ring provided on the first side of the dielectric layer;
    a ground ring provided on the first side of the dielectric layer;
    a plurality of traces provided on the first side of the dielectric layer; and
    a plurality of deformable metal layer portions provided on the first side of the dielectric layer, each one of the plurality of deformable metal layer portions partially positioned over one of the cut-outs and electrically coupled to the stiffener through the cut-out, at least one of the plurality of deformable metal layer portions coupled to at least one of the plurality of traces on the first side of the dielectric layer.

2. The ball grid array assembly of claim 1, wherein the stiffener serves as a ground plane and is electrically coupled to the ground ring.

3. The ball grid array assembly of claim 2, wherein the ground ring includes a deformable metal layer portion electrically coupled to the heat spreader through a cut-out.

4. The ball grid array assembly of claim 2, wherein the ground ring is electrically coupled to the stiffener through at least one wire bond.

5. The ball grid array assembly of claim 2, wherein a select number of the plurality of traces serve as ground connections and are electrically coupled to one another on the first side of the dielectric layer, the select number of the plurality of traces that serve as ground connections are electrically coupled to the stiffener through a deformable metal layer portion.

6. The ball grid array assembly of claim 1, wherein the stiffener serves as a power plane and is electrically coupled to the power ring.

7. The ball grid array assembly of claim 6, wherein the power ring includes a deformable metal layer portion electrically coupled to the stiffener through a cut-out.

8. The ball grid array assembly of claim 6, wherein a select number of the plurality of traces serve as power connections and are electrically coupled to one another on the first side of the dielectric layer, the select number of the plurality of traces that serve as power connections are electrically coupled to the stiffener through a deformable metal layer portion.

9. The ball grid array assembly of claim 1, wherein at least one of the plurality of deformable metal layer portions is electrically coupled to the stiffener using a spot weld.

10. The ball grid array assembly of claim 1, wherein the ground ring includes segments.

11. The ball grid array assembly of claim 1, wherein the power ring includes segments.

12. The ball grid array assembly of claim 1, wherein the power ring includes extension branches.

13. The ball grid array assembly of claim 1, wherein the ground ring includes extension branches.

14. The ball grid array assembly of claim 1, further comprising:
    a plurality of solder balls each coupled to one of the plurality of traces.

15. A semiconductor package having a deformable metal layer, the semiconductor package comprising:
    a heat spreader;
    a stiffener having a cavity formed therein and mounted to the heat spreader;
    a substrate having a dielectric layer with a first side and a second side, the substrate coupled to the stiffener through the second side of the dielectric layer, the substrate also having a deformable metal layer provided on the first side of the dielectric layer, and a plurality of solder balls, the dielectric layer having a cavity and cut-outs formed therein, the deformable metal layer having a cavity provided at least partially coincident with the cavity of the dielectric layer, a power ring, a ground ring, and a plurality of traces serving as either a ground connection, a signal connection, or a power connection for coupling with the plurality of solder balls to provide an external connection to the semiconductor package, the deformable metal layer also having a plurality of deformable metal layer portions each partially positioned over one of the cut-outs in the dielectric layer and electrically coupled to the stiffener through the cut-out, at least one of the plurality of deformable metal layer portions coupled to at least one of the plurality of traces on the first side of the dielectric layer; and
    a die mounted to the heat spreader through the cavity in the substrate and the stiffener, the die having a signal die bond pad coupled to a trace of the plurality of traces, a power die bond pad coupled to the power ring, and a ground die bond pad coupled to the ground ring.

16. The semiconductor package of claim 15, wherein the stiffener and the heat spreader are implemented as one structure.

17. The semiconductor package of claim 15, wherein the stiffener and the heat spreader are electrically coupled.

18. The semiconductor package of claim 15, wherein the stiffener and the heat spreader are not electrically coupled.

19. A method for forming a structure using a deformable metal layer comprising the steps of:

forming a cavity and cut-outs in a dielectric layer;

bonding a deformable metal layer to the dielectric layer to form a substrate;

forming a cavity opening, a power ring, a ground ring, and a plurality of traces using the deformable metal layer, each of the plurality of traces serving as either a ground connection, a signal connection, or a power connection;

mounting a stiffener to a heat spreader, the stiffener having a cavity formed therein;

mounting the substrate to the stiffener; and deforming portions of the deformable metal layer over the cut-outs to electrically couple these portions to the stiffener.

20. The method of claim 19, wherein the bonding a deformable metal layer to the dielectric layer step is performed before the forming a cavity and cut-outs step.

21. The method of claim 19, including additional steps to form a ball grid array package, the additional steps comprising:

mounting a die to the heat spreader through the cavity in the substrate and stiffener; and performing wire bonding to couple a die bond pad to the deformable metal layer.

22. The method of claim 21, further comprising the steps of:

sealing the die in the cavity; and forming solder balls to attach to either the ground connection, the signal connection, or the power connection of the deformable metal layer.

23. The method of claim 21, wherein the performing wire bonding to couple a die bond pad to the deformable metal layer step includes the following steps:

coupling a ground die bond pad of the die to the ground ring;

coupling a power die bond pad of the die to the power ring; and coupling a signal die bond pad of the die to a signal connection.

24. The method of claim 19, wherein the deforming portions of the deformable metal layer step includes spot welding to electrically couple these portions to the stiffener.

25. The method of claim 19, further comprising the step of:

electrically coupling the ground ring to the stiffener using a wire bond.

* * * * *